United States Patent [19]

Shoji

[11] Patent Number: 5,783,036
[45] Date of Patent: Jul. 21, 1998

[54] METHOD FOR DRY ETCHING METAL FILMS HAVING HIGH MELTING POINTS

[75] Inventor: Hideyuki Shoji, Tokyo, Japan

[73] Assignee: NEC Corporation, Japan

[21] Appl. No.: 630,554

[22] Filed: Apr. 10, 1996

Related U.S. Application Data

[63] Continuation of Ser. No. 327,648, Oct. 24, 1994, abandoned.

[30] Foreign Application Priority Data

Nov. 1, 1993 [JP] Japan ................................. 5-273352

[51] Int. Cl.$^6$ ................... H01L 21/00; C23F 1/00
[52] U.S. Cl. ..................... 156/643.1; 156/656.1; 156/659.11; 216/67; 216/75; 437/190; 437/245; 252/79.1
[58] Field of Search ............... 156/643.1, 656.1, 156/659.11; 252/79.1; 216/67, 69, 75; 437/190, 192, 245

[56] References Cited

U.S. PATENT DOCUMENTS 5,160,408  11/1992  Long ..................... 156/643.1

FOREIGN PATENT DOCUMENTS 2-34920  2/1990  Japan.

Primary Examiner—William Powell
Attorney, Agent, or Firm—Ostrolenk, Faber, Gerb & Soffen, LLP

[57] ABSTRACT

A method is for dry etching metal films having a high melting point, such as tungsten (W) films. A $SiO_2$ film is grown on a silicon substrate after which a W film is deposited using sputtering technology. Then, a photoresist film is deposited and is patterned by optical lithography. A semiconductor substrate thus formed is placed in a dry etching system of a narrow gap type with an anode coupled configuration and is etched using a gas mixture composed of $SF_6$, $Cl_2$ and $O_2$ under conditions such that the flow rate ratio of the gases $SF_6/Cl_2/O_2$ are 20.0:0.5~1.5:3~7. With this, it is possible to achieve excellent selective etching of the W film with respect to the $SiO_2$ film that is used as an underlying film.

4 Claims, 9 Drawing Sheets

METHOD FOR DRY ETCHING METAL FILMS HAVING HIGH MELTING POINTS

This is a continuation of application Ser. No. 08/327,648 filed on Oct. 24, 1994, abandoned.

BACKGROUND OF THE INVENTION (1). Field of the Invention

The present invention relates to the etching of metal films having high melting points (high refractory metals), such as tungsten (W) films, that are used in the fabrication of semiconductor devices.

(2). Description of the Related Art

Generally, a tungsten (W) film is used as an interconnection or as a contact plug in semiconductor devices because it has favorable properties as buried interconnections and contact holes. Furthermore, in semiconductor devices, particularly for charge transfer devices such as a charge coupled device (CCD), it is used as an optical shielding film because it has a high reflectivity.

Conventional technology for etching tungsten films, as disclosed in Japanese Patent Application Kokai Publication No. Hei 2-34920, relates to a method for etching tungsten interconnections using $SF_6/Cl_2$ as a reaction gas. The disclosed conventional etching technology will be described below with reference to FIG. 1.

First, as shown in FIG. 1, a 300 nm thick W film 3 is deposited on a silicon substrate by sputtering, then a 1.0 μm thick photoresist film 4 is applied onto the tungsten film 3 and, after the photoresist film 4 is patterned by a stepper, reactive ion etching (RIE) is, carried out.

The RIE system used is a parallel plate type with a cathode coupled configuration and a discharge excitation frequency of 13.56 MHz. By using $SF_6/Cl_2$ etching gas it is possible to obtain anisotropic etching without giving rise to side etching of the W film 3.

Further, a method for forming a contact plug by etching back the whole surface of the W films by using $SF_6/Cl_2$ has been disclosed in U.S. patent application Ser. No. 436,429 filed on Nov. 14, 1989.

As shown in FIGS. 2A–2D, in this method, a heat endurable metal film 10, such as TiN or TiW, is formed on a silicon dioxide ($SiO_2$) film 2 which has been formed on a silicon substrate. This W film thus formed is then etched back in a narrow gap type dry etching system.

The etching method involves the following steps: firstly, 70% of the total thickness of the W film 3 is etched using $SF_6/O_2/He$ as shown in FIG. 2B, then the remainder of the W film 3 is etched using $SF_6/Cl_2/He$ as shown in FIG. 2C, and finally the heat endurable metal film 10 that forms a layer below the W film 3 is etched using $Cl_2/He$ as shown in FIG. 2D.

In the etching of W films using conventional technology, such as the former method of RIE where a cathode coupled type configuration is used, a high voltage difference arises between the plasma and the lower electrode and, if a $SiO_2$ film is used as the underlying film, then a selectivity ratio of only about 2~5 is attainable with respect to the $SiO_2$ film. Thus, this type of etching method is not suitable for processes where a high selectivity ratio for the $SiO_2$ film is required such as in the use of W films as optical shielding films for CCD applications.

Furthermore, the latter etching method lacks a step for detecting, without stopping the etching process, whether the thickness of the W film etched during the first stage etching is 70% of the initial thickness thereof, so that it is difficult to respond to variations in the film thickness or etch rate, resulting in a lack of stability.

Also, if the etching method used in the first stage is used for forming interconnections, then side etching occurs easily which makes it difficult to control the feature sizes and also there is a problem due to the poor selectivity ratio with respect to the $SiO_2$ film during the second stage etching.

SUMMARY OF THE INVENTION

An object of the present invention is to overcome the problems existing in the prior art and to provide a dry etching method of high melting point metal films, which enables the attainment of excellent selective etching of the high melting point metal films with respect to an underlying silicon oxide film.

According to one aspect of the invention, the dry etching method of high melting point metal films uses $SF_6/Cl_2/O_2$ as an etching gas and etching is carried out by an anode coupled type dry etching system where the flow rate ratios of the respective gases are set to be in the range of $SF_6:Cl_2:O_2=20.0:0.5~1.5:3~7$. The anode coupled type dry etching system has the advantage that a high selectivity ratio is possible because a high voltage difference does not arise between the plasma and the lower electrode.

According to the invention, since the mixture of $SF_6$ and $Cl_2$ and $O_2$ is used as the etching gas and the etching is carried out in the anode type dry etching system, it is possible to achieve excellent selective etching of a high melting point metal film with respect to a silicon oxide film that is used as the underlying film.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are described with reference to the attached drawings.

Figure 1:
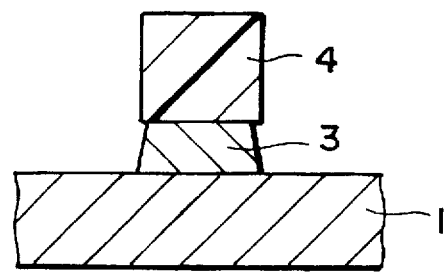
FIG. 1 is a cross-sectional view of a semiconductor chip used to describe a conventional dry etching of a tungsten film.
Figure 2A:
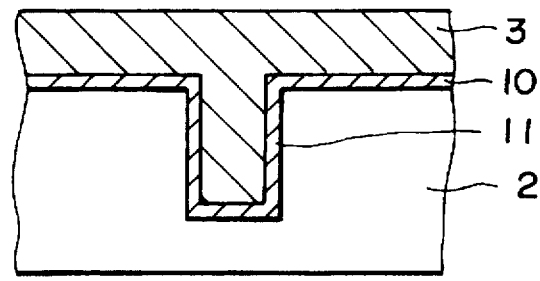
FIGS. 2A–2D are cross-sectional views of a semiconductor chip used to describe another conventional dry etching of a tungsten film.
Figure 2B:
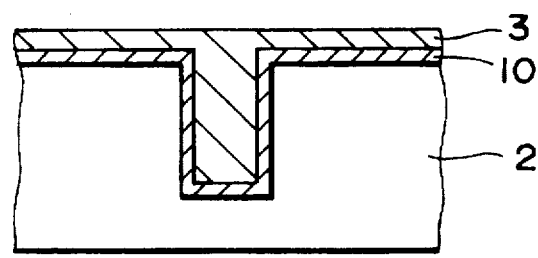
Figure 2C:
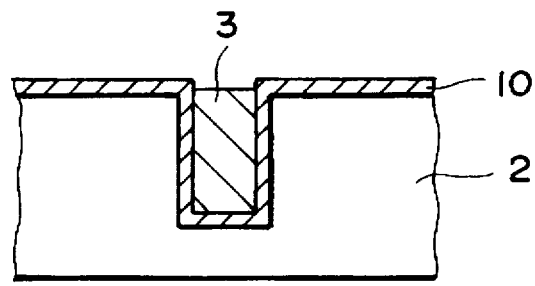
Figure 2D:
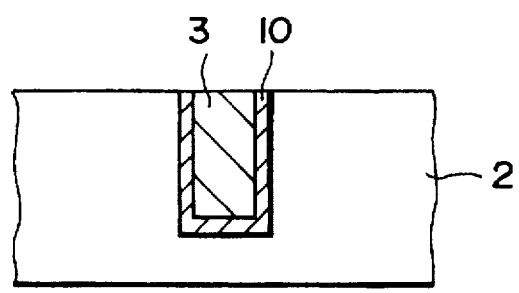
Figure 3:
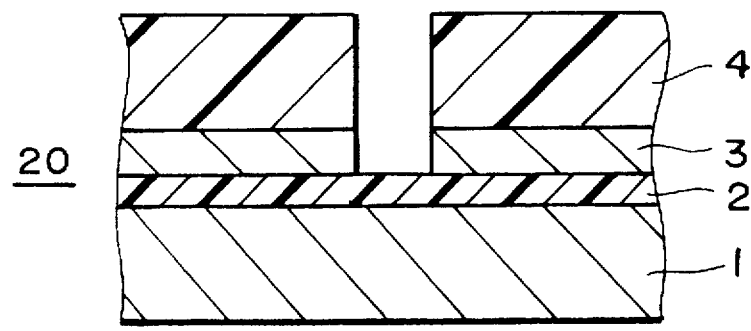
FIG. 3 is a cross-sectional view of a semiconductor chip used for describing an embodiment of the invention.

FIG. 3 shows, in a cross-sectional view, a semiconductor chip that will be used to describe the dry etching method of tungsten films in a first embodiment according to the invention.

Firstly, as shown in FIG. 3, a $SiO_2$ film 2, approximately 220 nm thick, is grown on a silicon substrate 1 after which a W film 3 is deposited using sputtering technology. A suitable thickness of the W film is approximately 400 nm in the case where it is to be used as an optical shielding film for CCDs and in the case of interconnections a thickness greater than 400 nm is suitable. Next, a photoresist film 4 is deposited over the whole surface and it is patterned. In this way, a semiconductor substrate 20 to be etched is formed.

Figure 4:
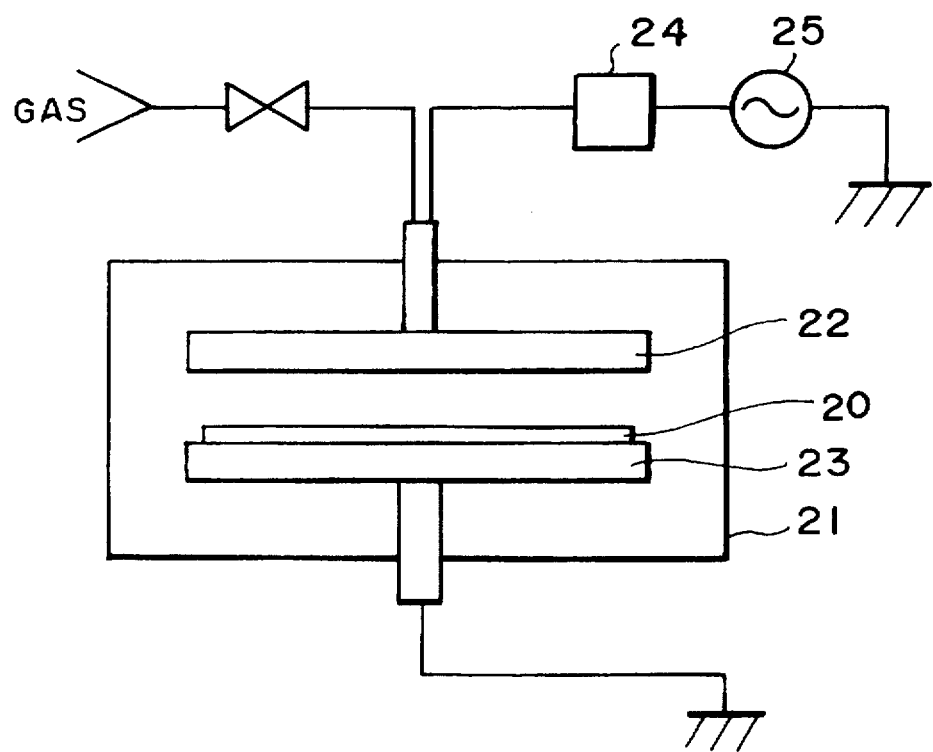
FIG. 4 is a schematic cross-sectional view of a dry etching system used in the embodiment of this invention.

After this, as shown in FIG. 4, the semiconductor substrate 20 is etched in a narrow gap type dry etching system of an anode coupled configuration which has two oppositely facing electrodes, namely, an upper electrode 22 and a lower electrode 23, inside a reaction chamber 21 having a gas supply mechanism in its upper section, and in which a radio frequency (RF) power supply 25 is connected to the upper electrode 22 through a matching box 24. The semiconductor substrate 20 is placed on the lower electrode 23.

The etching conditions are set such that the flow rates of the $SF_6$, $Cl_2$ and $O_2$ are 200 sccm, 10 sccm and 50 sccm, respectively, the chamber pressure is 250 mTorr, the RF power density is 0.55 W/cm$^2$ and the electrode separation (gap between electrodes) is 0.8 cm. As a result it was possible to obtain an extremely good selectivity ratio of approximately 15 with respect to the $SiO_2$ film that was formed as a layer underlying the tungsten film 3.

The reason for using $SF_6/Cl_2/O_2$ gas in this invention is described next.

Figure 5:
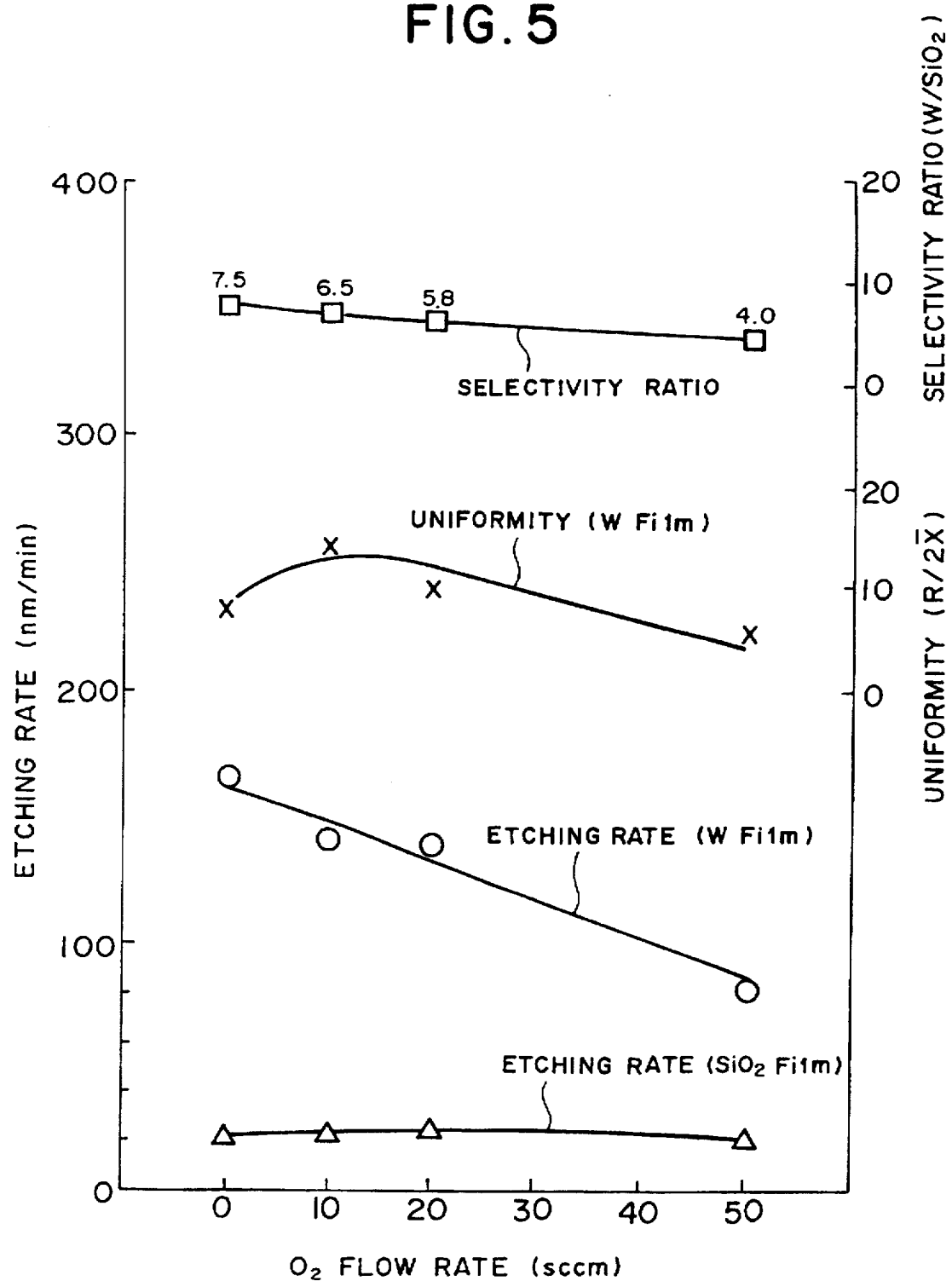
FIG. 5 is a graph showing etching characteristics (etch rate and flow rate) of the conditions used for describing the dry etching method of the invention.

FIG. 5 shows the dependency on $O_2$ flow rate of the etch rate, uniformity, and selectivity ratio of a W film that was etched in a narrow gap type dry etching system as used in this embodiment of the invention, where $SF_6/O_2$ was used as the etching gas. In FIG. 5, the conditions are set such that the flow rates of the $SF_6$, $Cl_2$, and $O_2$ are 200 sccm, 10 sccm and 50 sccm respectively. As shown in FIG. 5, the etch rate of the W film decreases with increasing $O_2$ flow rate, and the selectivity ratio of the W film with respect to the $SiO_2$ film is 4~7.5, which is a low value and cannot be said to be a desirable etching condition.

Figure 6:
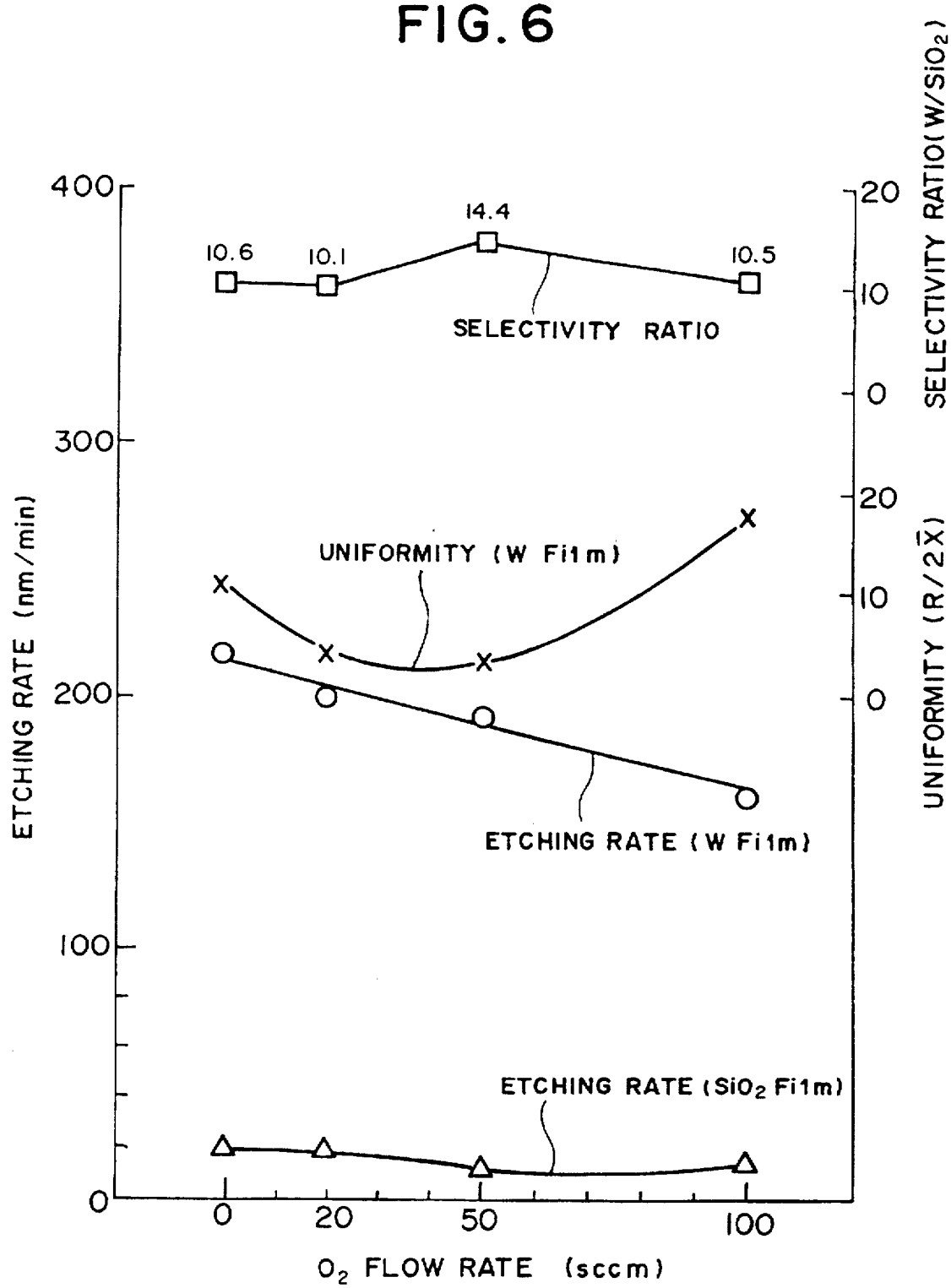
FIG. 6 is a graph showing etching characteristics (etch rate and flow rate) of the conditions used for describing the dry etching method of the invention.

FIG. 6 shows the etching characteristics of a W film that was etched in a narrow gap type dry etching system as used in this embodiment of this invention, where the $O_2$ flow rate was changed with $SF_6$ and $Cl_2$ being kept constant at 200 sccm and 10 sccm, respectively. The reason for adding $Cl_2$ was in order to increase the W film etch rate and increase the selectivity with respect to the underlying $SiO_2$ film.

As shown in FIG. 6, it was possible to obtain a selectivity ratio of 14.4 with respect to the W film when the $O_2$ flow rate was 50 sccm. This is because the etch rate of the $SiO_2$ film is decreasing when the $O_2$ flow rate is 50 sccm. This is thought to be due to the suppression of the reaction between sulfur (S) and the oxygen ($O_2$) of the $SiO_2$ film.

Figure 7:
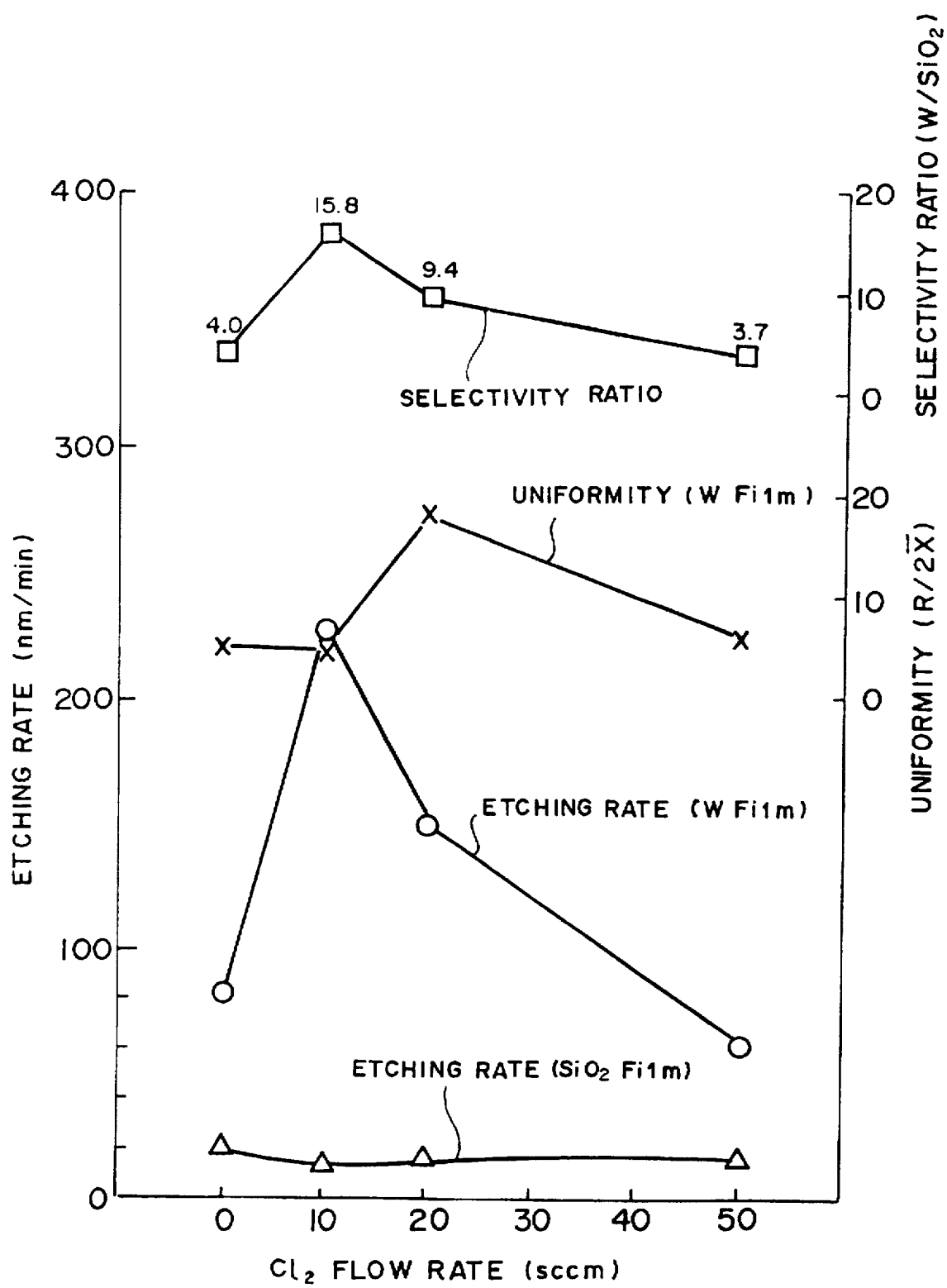
FIG. 7 is a graph showing etching characteristics (etch rate and flow rate) of the conditions used for describing the dry etching method of the invention.
Figure 8:
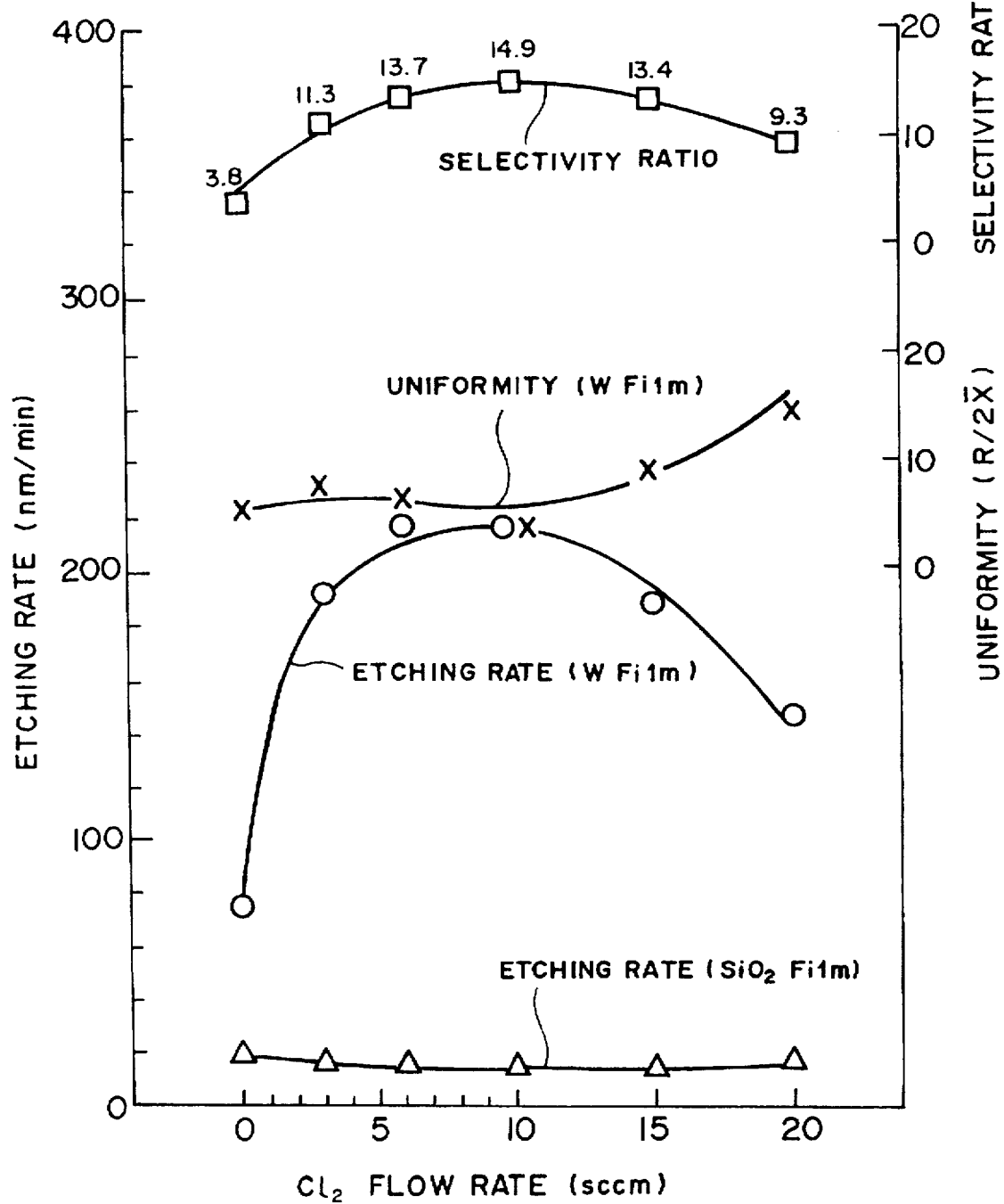
FIG. 8 is a graph showing etching characteristics (etch rate and flow rate) of the conditions used for describing the dry etching method of the invention.

Next, FIG. 7 shows the etching characteristics of a W film that was etched in a narrow gap type dry etching system as used in this embodiment of the invention, where the $Cl_2$ flow rate was changed with the flow rates of $SF_6$ and $O_2$ being kept at 220 sccm and 50 sccm, respectively. As shown in FIG. 7, a selectivity ratio of the W film of 15.8 was obtained with respect to the $SiO_2$ film. Also, by the addition of only 10 sccm of $Cl_2$, the etch rate of the W film increases by approximately three times and, when more than 20 sccm is added, the etch rate decreases accompanied by a decrease of the selectivity ratio with respect to the $SiO_2$ film. The origin of the decrease of the W film etch rate is thought to be due to a suppression of the etch rate by the by-products such as WCl (x being an integer) that are produced during the reaction between tungsten and chlorine ($Cl_2$). FIG. 8 shows the etching characteristics of the W film as shown in FIG. 7 but in the range where the $Cl_2$ is 0~20 sccm and where the W etch rate shows an abrupt change. As shown in FIG. 8, a good value of 13.4~14.9 for the selectivity ratio of the W film with respect to the $SiO_2$ film is obtained under conditions such that the $Cl_2$ flow rate is 5~15 sccm.

It can be seen from these results that in this method for etching W films, it is possible to obtain extremely good selective etching of the W film with respect to the underlying $SiO_2$ film using $SF_6/Cl_2/O_2$, where the respective gas flow rates are $SF_6:Cl_2:O_2=20.0:0.5~1.5:3~7$.

Figure 9:
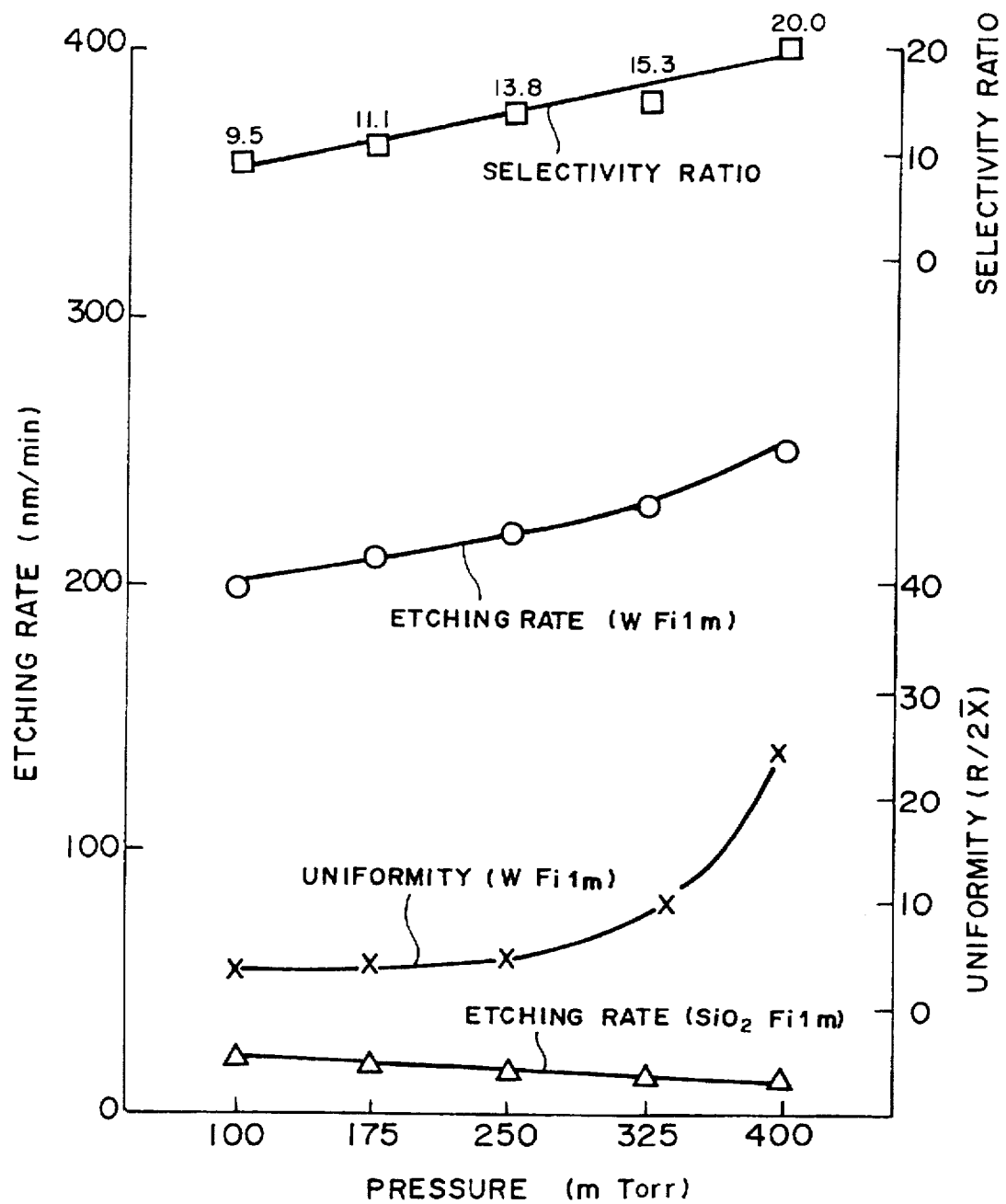
FIG. 9 is a graph showing etching characteristics (effect of etching pressure) of the conditions used for describing the dry etching method of the invention.

FIG. 9 shows the effect of etching pressure on the etching characteristics. In FIG. 9, the flow rates of the $SF_6$, and $Cl_2$ are 200 sccm and 10 sccm respectively. It can be seen that when the etching pressure is in the range 100~175 mTorr, the selectivity ratio with respect to the $SiO_2$ film is low at about 10, and also that when the pressure is greater than 325 mTorr there is a degradation of the uniformity of the W film etching and thus a pressure of about 250 mtorr is the most suitable pressure condition.

Figure 10:
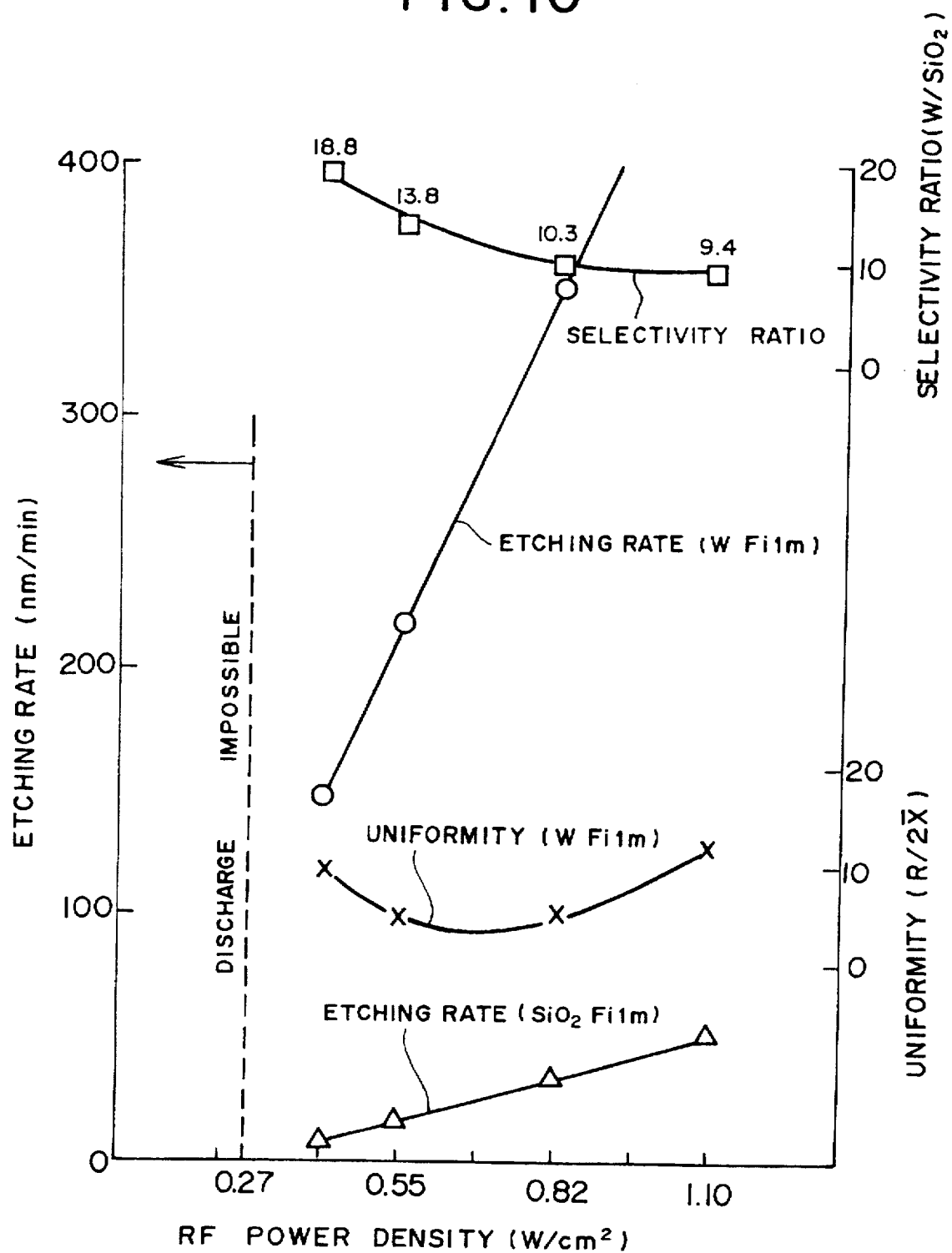
FIG. 10 is a graph showing etching characteristics (effect of RF power density) of the conditions used for describing the dry etching method of the invention.

FIG. 10 shows the effect of RF power density on the etching properties. In FIG. 10, the conditions are set such that the flow rates of the $SF_6$, $Cl_2$, and $O_2$ are 200 sccm, 10 sccm and 50 sccm respectively. From the selectivity with respect to the $SiO_2$ film, the uniformity of the W film etching and the stability of the discharge, it can be seen that the most suitable RF power density was about 0.55 W/cm$^2$.

Furthermore, in this embodiment of the invention, an anode coupled type dry etching system of a narrow gap type is used because by using such a configuration it is possible to increase the etch rate of the W film by being able to attain a high density of plasma compared with general RIE and dry etching systems due to the narrow distance between the electrodes in this case. Because of this it is possible to obtain excellent selective etching with respect to silicon dioxide films even in a general anode coupled type dry etching system.

By, for example, monitoring the 704 nm wavelength luminescence, it is possible to detect the final point of etching and attain good reproducibility and control.

In this embodiment of the invention the etching of W films was described but similar results were obtained for etching of other high melting point metal films such as molybdenum (Mo) and tantalum (Ta).

Figure 11A:
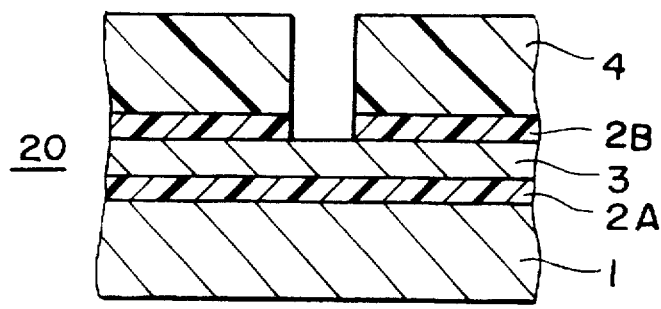
FIGS. 11A and 11B are cross-sectional views of a semiconductor chip used for describing a second embodiment of the present invention.
Figure 11B:
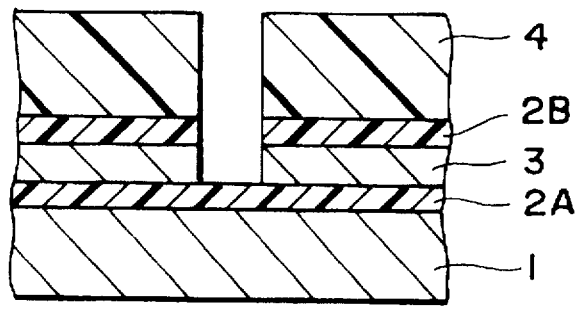

FIGS. 11A and 11B are cross-sectional views of a semiconductor chip for describing a second embodiment of the invention, in which the foregoing first embodiment of the invention is applied particularly in the case where $SiO_2$ films are provided respectively above and below the W film.

As shown in FIG. 11A, firstly, after growing a $SiO_2$ film 2A on a silicon substrate 1, a W film 3 is deposited using the sputtering technology. Then, a $SiO_2$ film 2B is grown on top of this, and then a photoresist film 4 is applied and patterned using the optical lithography technique. In this way, a semiconductor substrate 20 to be etched is formed.

Figure 12:
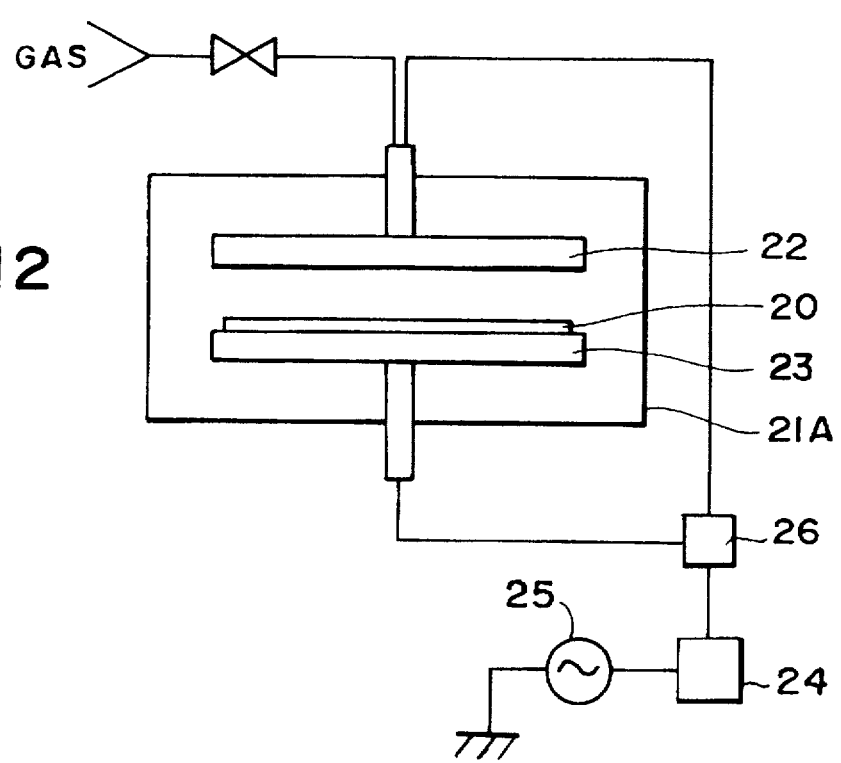
FIG. 12 is a schematic cross-sectional view of a dry etching system used in the second embodiment of the invention.

Following this, as shown in FIG. 12, this semiconductor substrate 20 is etched in a dry etching system which has two oppositely facing electrodes, namely, an upper electrode 22 and a lower electrode 23, inside a reaction chamber 21A having a gas supply mechanism in its upper section, and in which an RF power supply 25 is provided such that it can be applied either to the upper electrode 22 or the lower electrode 23 via a matching box 24 and a switching means 26. The semiconductor substrate 20 is placed on the lower electrode 23.

First, the $SiO_2$ film 2B on the W film is etched. The RF power supply 25 is set so that it is applied to the lower electrode 23, and as shown in FIG. 11A, the $SiO_2$ film 2B is etched under conditions such that the $CF_4$ flow rate is 100 sccm, pressure is 100 mTorr, RF power density is 2.75 $W/cm^2$ and electrode separation is 5 cm.

Next, the W film 3 is etched. The etching is carried out in the same way as the first embodiment of the invention and the RF power supply 25 is set to be applied to the upper electrode 22, the $SF_6$ flow rate is 220 sccm, $Cl_2$ flow rate is 10 sccm, $O_2$ flow rate is 50 sccm, pressure is 250 mTorr, RF power density is 0.55 $W/cm^2$ and electrode separation is 0.8 cm.

The result, as shown in FIG. 11B, is that excellent selective etching of the W film 3 with respect to the $SiO_2$ film which is below the W film 3 was carried out. In this embodiment, since a silicon oxide film 2B, having lower reflectivity than W film, is grown on a W film 3, the reproducibility of the pattern formation using a photoresist film is stable and it is possible to achieve excellent etching process accuracy.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for dry etching a metal film having a high melting point in a semiconductor substrate where said metal film is deposited on a silicon substrate with an underlaying silicon oxide film being interposed therebetween, the method comprising the steps of:

placing said semiconductor substrate in an anode coupled type dry etching system; and etching said metal film with high selectivity with respect to said silicon oxide film in said dry etching system by utilizing a gas mixture composed of $SF_6$, $Cl_2$ and $O_2$ as an etching gas, wherein said etching gas employs a gas mixture wherein flow rates of $SF_6$, $Cl_2$ and $O_2$ are 20:0.5~1.5:3–7, respectively.

2. A method for dry etching a metal film having a high melting point in a semiconductor substrate where said metal film is deposited on a silicon substrate with an underlaying silicon oxide film being interposed therebetween, the method comprising the steps of:

placing said semiconductor substrate in an anode coupled type dry etching system; and etching said metal film with high selectivity with respect to said silicon oxide film in said dry etching system by utilizing a gas mixture composed of $SF_6$, $Cl_2$ and $O_2$ as an etching gas, wherein said step of etching is carried out under conditions such that flow rates of said $SF_6$, said $Cl_2$ and said $O_2$ are 200 sccm, 10 sccm and 50 sccm, respectively, a chamber pressure is 250 mTorr, an RF power density is 0.55 $W/cm^2$ and an electrode separation is 0.8 cm.

3. A method for dry etching a metal film having a high melting point in a semiconductor substrate where said metal film is deposited on a silicon substrate with an underlaying silicon oxide film being interposed therebetween, the method comprising the steps of:

placing said semiconductor substrate in a narrow gap type dry etching system of an anode coupled configuration which has an upper electrode and a lower electrode inside a chamber having a gas supply mechanism and in which an RF power supply is applied to said upper electrode through a matching box; and etching said metal film with high selectivity with respect to said silicon oxide film in said dry etching system by utilizing a gas mixture composed of $SF_6$, $Cl_2$ and $O_2$ as an etching gas.

4. A method for dry etching a metal film having a high melting point in a semiconductor substrate where said metal film is deposited on a silicon substrate with an underlaying oxide film being interposed therebetween, the method comprising the steps of:

placing said semiconductor substrate in a narrow gap type dry etching system of an anode coupled configuration which has an upper electrode and a lower electrode inside a chamber having a gas supply mechanism and in which an RF power supply can be applied to one of said upper electrode and said lower electrode through a matching box; and etching said metal film with high selectivity with respect to said silicon oxide film in said dry etching system by utilizing a gas mixture composed of $SF_6$, $Cl_2$ and $O_2$ as an etching gas.

* * * * *